(12) United States Patent
Eggers et al.

(10) Patent No.: US 11,360,172 B2
(45) Date of Patent: Jun. 14, 2022

(54) ZERO ECHO TIME MR IMAGING WITH WATER-FAT SEPARATION

(71) Applicant: KONINKLIJKE PHILIPS N.V., Eindhoven (NL)

(72) Inventors: Holger Eggers, Ellerhoop (DE); Johan Samuel Van Den Brink, Meteren (NL)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 16/972,019

(22) PCT Filed: May 30, 2019

(86) PCT No.: PCT/EP2019/064125
§ 371 (c)(1),
(2) Date: Dec. 4, 2020

(87) PCT Pub. No.: WO2019/233881
PCT Pub. Date: Dec. 12, 2019

(65) Prior Publication Data
US 2021/0231761 A1    Jul. 29, 2021

(30) Foreign Application Priority Data
Jun. 5, 2018 (EP) ..................... 18175926

(51) Int. Cl.
*G01R 33/48* (2006.01)
*G01R 33/485* (2006.01)
(Continued)

(52) U.S. Cl.
CPC ....... *G01R 33/4828* (2013.01); *G01R 33/485* (2013.01); *G01R 33/4824* (2013.01); *G01R 33/50* (2013.01); *G01R 33/5607* (2013.01)

(58) Field of Classification Search
USPC ....................................... 324/309
See application file for complete search history.

(56) References Cited

U.S. PATENT DOCUMENTS

| 6,549,008 | B1 * | 4/2003 | Anand | ................ | G01R 33/54 324/307 |
| 2014/0084924 | A1 | 3/2014 | Grodzki | | |

(Continued)

OTHER PUBLICATIONS

Eggers et al. "Dual Echo Dixon Imaging With Flexible Choice of Echo Times" Magnetic Resonance in Med. 65 p. 96-107 2011.

(Continued)

*Primary Examiner* — Rodney E Fuller

(57) ABSTRACT

A method of magnetic resonance (MR) imaging to enable 'silent' zero echo time (ZTE) imaging in combination with water/fat separation. The method includes subjecting the object to a first self-refocusing zero echo time imaging sequence, wherein a first sequence of gradient echo signals is acquired as a first number $N_1$ of radial k-space spokes at a first repetition time $TR_1$; subjecting the object to a second self-refocusing zero echo time imaging sequence, wherein a second sequence of gradient echo signals is acquired as a second number $N_2$ of radial k-space spokes at a second repetition time $TR_2$, wherein $N_2 \neq N_1$ and/or $TR_2 \neq TR_1$; and reconstructing a MR image from the acquired gradient echo signals. Signal contributions of chemical species (e.g., water and fat) may be separated exploiting the different echo times attributed to the gradient echo signals.

11 Claims, 2 Drawing Sheets

(51) Int. Cl.
  *G01R 33/50* (2006.01)
  *G01R 33/56* (2006.01)

(56) References Cited

U.S. PATENT DOCUMENTS

| | | |
|---|---|---|
| 2015/0115956 A1 | 4/2015 | Ackerman et al. |
| 2016/0047874 A1 | 2/2016 | Grodzki et al. |
| 2016/0313421 A1 | 10/2016 | Fuderer |
| 2017/0307703 A1 | 10/2017 | Wiesinger |

OTHER PUBLICATIONS

Huanzhou Yu et al: "Multiecho reconstruction for simultaneous water-fat decomposition and T2* estimation", Journal of Magnetic Resonance Imaging, vol. 26, No. 4, Sep. 25, 2007 (Sep. 25, 2007), pp. 1153-1161.

Romain Froidevaux et al: "Filling the dead-time gap in zero echo time MRI:Principles compared", Magnetic Resonance in Medicine. ,Aug. 30, 2017 (Aug. 30, 2017).

International Search Report and Written Opinion From PCT/EP2019/064125 dated Aug. 9, 2019.

Gaspar Delso et al., "Clinical Evaluation of Zero-Echo-Time MR Imaging for the Segmentation of the Skull" J Nucl Med 2015; 56:417-422.

M. Weiger et al., "MRI with Zero Echo Time"e MagRes, 2012, vol. 1: 311-322. DOI 10.1002/9780470034590.emrstm1292.

Dimitrios C. Karampinos et al., "Chemical Shift-Based Water/Fat Separation in the Presence of Susceptibility-Induced Fat Resonance Shift" Magnetic Resonance in Medicine 68:1495-1505 (2012).

Andrew P. Leynes et al., "Hybrid ZTE/Dixon MR-based attenuation correction for quantitative uptake estimation of pelvic lesions in PET/MRI" Med. Phys. 44 (3), Mar. 2017.

Solana AB, Menini A, Wiesinger F. Looping star: A novel, self-refocusing zero TE imaging strategy. Proceedings of the 24th Annual Meeting of the International Society of Magnetic Resonance in Medicine, Singapore, 2016; p. 104.

\* cited by examiner

ZERO ECHO TIME MR IMAGING WITH WATER-FAT SEPARATION

CROSS REFERENCE TO RELATED APPLICATIONS

This application is a U.S. national phase application of International Application No. PCT/EP2019/064125 filed on May 30, 2019, which claims the benefit of EP Application Serial No. 18175926.7 filed on Jun. 5, 2018 and is incorporated herein by reference.

FIELD OF THE INVENTION

The invention relates to the field of magnetic resonance (MR) imaging. It concerns a method of MR imaging of chemical species having at least two different resonance frequencies. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an alternating electromagnetic field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (flip angle of 90°).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneity) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation or other appropriate reconstruction algorithms.

MR imaging of tissues with very short transverse relaxation times, such as bone or lung, is becoming increasingly important. Nearly all known methods for this purpose basically employ three-dimensional (3D) radial k-space sampling. In the so-called zero echo time (ZTE) technique a readout gradient is set before excitation of magnetic resonance with a high-bandwidth and thus short, hard RF pulse. In this way, gradient encoding starts instantaneously upon excitation of magnetic resonance. The acquisition of a free induction decay (FID) signal starts immediately after the RF pulse resulting in an effectively zero 'echo time' (TE). After the acquisition, only minimal time is required for setting of the next readout gradient before the next RF pulse can be applied, thus enabling very short repetition times (TR). The readout direction is incrementally varied from repetition to repetition until a spherical volume in k-space is sampled to the required extent. Without the need for switching off the readout gradient between TR intervals, ZTE imaging can be performed virtually silently.

In MR imaging, it is often desired to obtain information about the relative contribution of different chemical species, such as water and fat, to the overall signal, either to suppress the contribution of some of them or to separately or jointly analyze the contribution of all of them. It is well-known that these contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. In particular for water-fat separation, these types of experiments are often referred to as Dixon-type of measurements. The water-fat separation is possible because there is a known precessional frequency difference of hydrogen in fat and water. In its simplest form, water and fat images are generated by either addition or subtraction of the 'in phase' and 'out of phase' datasets. Other chemical species with other chemical shifts can be separated similarly based on chemical shift encoding.

The known Dixon-type water-fat separation techniques rely on the acquisition of two or more images at different echo times by an appropriate imaging sequence. In conventional ZTE imaging, only images with an echo time value of zero are acquired. The known Dixon techniques are thus not applicable in combination with conventional ZTE imaging.

SUMMARY OF THE INVENTION

From the foregoing it is readily appreciated that there is a need for an improved method of ZTE imaging. It is an object of the invention to enable 'silent' ZTE imaging in combination with water-fat separation.

In accordance with the invention, a method of MR imaging of an object positioned in the examination volume of a MR device is disclosed. The method of the invention comprises the steps of:

subjecting the object to a first self-refocusing zero echo time imaging sequence, wherein a first sequence of gradient echo signals is acquired as a first number $N_1$ of radial k-space spokes at a first repetition time $TR_1$, which first number $N_1$ of radial k-space spokes forms a first closed trajectory in k-space;

subjecting the object to a second self-refocusing zero echo time imaging sequence, wherein a second sequence of gradient echo signals is acquired as a second number $N_2$ of radial k-space spokes at a second repetition time $TR_2$, which second number $N_2$ of radial k-space spokes forms a second closed trajectory in k-space, wherein $N_2$ is not equal to $N_1$ and/or $TR_1$ is not equal to $TR_2$; and reconstructing a MR image from the acquired gradient echo signals.

Signal contributions of two or more chemical species to the gradient echo signals may be separated exploiting the different echo times attributed to the gradient echo signals of the first and second sequences of gradient echo signals respectively.

The invention adopts the self-refocusing ZTE imaging sequence as proposed in US 2017/0307703 A1. In the self-refocusing ZTE imaging sequence, a gradient echo refocusing is added to the conventional ZTE imaging sequence. Like in conventional ZTE imaging, the amplitude of the readout gradient is kept constant and only directional updates of the readout gradient are applied between repetitions until a full spherical volume in k-space is sampled, resulting in silent three-dimensional radial imaging. RF excitation is achieved by short RF pulses in the presence of the readout gradient. The self-refocusing ZTE imaging sequence is organized in a number of (two or more) segments, and each segment is divided into a number of loops. Each loop includes the acquisition of a number of radial k-space spokes. RF excitation is performed only in the first loop (the FID acquisition loop) and not in the subsequent second and further loops (the gradient echo acquisition loops). The radial k-space spokes of each loop cumulatively form a closed trajectory in k-space. In this way, the second and further loops form gradient echoes of the initial FIDs excited in the first loop. The echo time TE of the gradient echoes is given by $$TE=(e-1)*N*TR,$$

wherein TR is the repetition time of the radial acquisitions, e is the loop counter, and N is the number of radial k-space spokes acquired in each loop. TR is typically short (on the order of a millisecond). The amplitude of the readout gradient is kept constant throughout the acquisition, while the direction of the readout gradient is updated in each TR. In order for the self-refocusing ZTE imaging sequence to remain silent, the readout gradient direction must not be altered too much at a time. This entails that N cannot be small and that the TEs of the gradient echoes cannot be short. On the other hand, for Dixon water-fat separation methods to be robust, the echo spacing must be short. Therefore, the application of the multi-acquisition strategy described in the following is suggested by the invention to overcome this limitation of the known self-refocusing ZTE imaging sequence.

The invention proposes that the self-refocusing ZTE imaging sequence is repeated by application of the above-mentioned first and second self-refocusing ZTE imaging sequences, wherein the number of radial k-space spokes and/or the repetition time used in the individual loops of the second self-refocusing ZTE imaging sequence ($N_2$, $TR_2$) differs from the number of radial k-space spokes and/or the repetition time used in the first self-refocusing ZTE imaging sequence ($N_1$, $TR_1$). The difference between the numbers of spokes and/or the repetition times used in the two instances of the ZTE imaging sequence entails that the echo time attributed to the gradient echo signals of the acquired first series of gradient echoes differs from the echo time attributed to the gradient echo signals of the acquired second series of gradient echo signals. The difference, the so-called echo spacing given by $$\Delta TE=|N_2*TR_2-N_1*TR_1|,$$

can be tuned as required by appropriate selection of the numbers of radial k-space spokes and/or repetition time values used in the first and second ZTE imaging sequences respectively. If the numbers of k-space spokes and repetition time values are selected to be similar, the resulting echo spacing can be on the order of one millisecond, which is well-suited for robust water-fat separation by a per se known Dixon technique. A technique for water-fat separation from MR signals sampled at arbitrary echo times, which is principally applicable for the method of invention, is for example described by Eggers et al. (Magnetic Resonance in Medicine, 65: 96-107, 2011).

It has to be noted in this context that the approach of the invention does not require that the same k-space positions are sampled at the two or more different echo times. Because of the different numbers of k-space spokes used in the first and second ZTE imaging sequences according to the invention, the acquired k-space positions will generally be different. The numbers and distributions of sampled k-space positions at the different echo times only have to be, individually or collectively, adequate for reconstructing an MR image of sufficient quality.

In a typical embodiment of the invention, the separation of the signal contributions of the chemical species is performed on the basis of a signal model. The signal model theoretically describes the acquired gradient echo signals as function of the respective echo time (as determined by the different numbers of k-space spokes and repetition time values). The signal model includes at least the (a-priori known) MR spectrum and the (unknown) spin density of each of the chemical species. It may further include the (unknown) spatial variation of the main magnetic field in the examination volume, since any inhomogeneity of the main magnetic field causes phase errors in the acquired gradient echo signals, which need to be distinguished from the phase offsets induced by chemical shift. In the process of reconstructing an MR image, wherein signal contributions of the chemical species are separated, values of all unknown parameters of the signal model are sought that best fit the acquired gradient echo signals.

Besides for water-fat separation, the short echo spacing provided by the invention is also of advantage for 'silent' effective transverse relaxation time constant ($T_2^*$)-weighted imaging and quantification, among others.

The term 'radial k-space spokes' used herein is to be understood to cover both straight and bended radial k-space spokes. Bended radial k-space spokes would involve a once-only, a repeated, or a continuous variation of the readout direction during the acquisition of the gradient echo signals. In a possible embodiment, bended radial k-space spoke may form a circle as first and/or second closed trajectory in k-space within the meaning of the invention.

The invention is not restricted to the application of two ZTE imaging sequences with different numbers of k-space spokes or different repetition time values. It may comprise subjecting the object to at least one further self-refocusing ZTE imaging sequence, wherein a further sequence of gradient echo signals is acquired as a further number $N_i$ (i=3, 4, ... ) of radial k-space spokes at a further repetition time $T_i$, which further number $N_i$ of radial k-space spokes forms a further closed trajectory in k-space, with $N_i$ being different from both $N_2$ and $N_1$, and reconstructing the MR image from the acquired gradient echo signals, wherein signal contributions of the two or more chemical species to the gradient echo signals are separated exploiting the different echo times attributed to the gradient echo signals of the first, second and further sequences of gradient echo signals respectively.

The FID signals may also be acquired and be used to improve the reconstruction of the MR image, for example to determine the spin density and/or the spatial variation of the main magnetic field. They enable a reduction of noise and/or of $T_2^*$ weighting. Moreover, a correction for motion occurring between the first, second and, where applicable, further self-refocusing ZTE imaging sequences can be based on the FID signals, for example by using them as navigators for motion detection or motion compensation.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit. The method of the invention is preferably implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
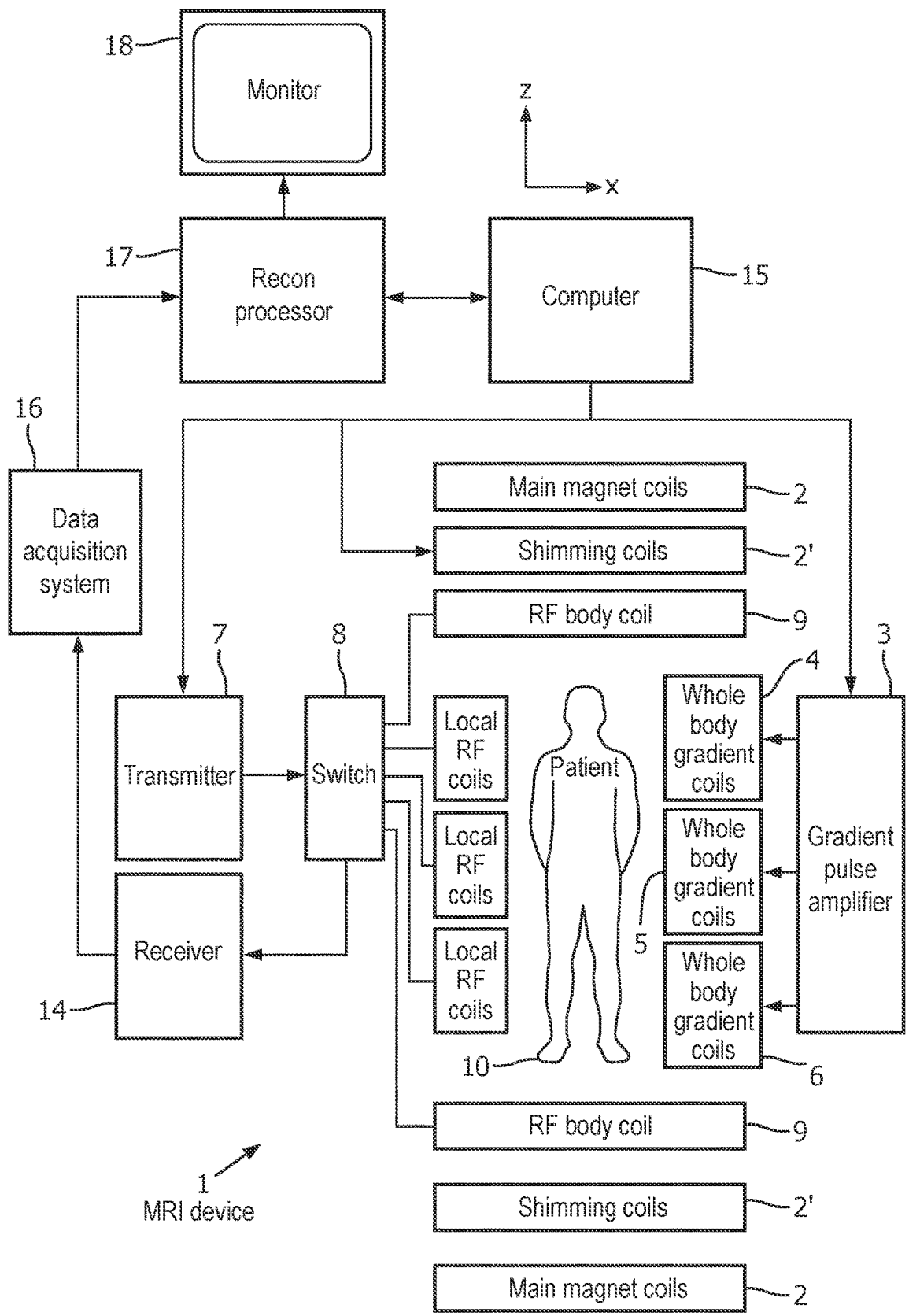
FIG. 1 schematically shows a MR device for carrying out the method of the invention.

With reference to FIG. 1, a MR device 1 which can be used for carrying out the method of the invention is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which taken together with any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the RF body coil 9 and/or by the RF array coils 11, 12, 13 and demodulated by a receiver 14 preferably including a preamplifier (not shown). The receiver 14 is connected to the RF coils 9, 11, 12 and 13 via send/receive switch 8.

A host computer 15 controls the current flow through the shimming coils 2' as well as the gradient pulse amplifier 3 and the transmitter 7 to generate a ZTE imaging sequence according to the invention. The receiver 14 receives a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in the acquisition of raw image data.

Ultimately, the digital raw image data is reconstructed into an image representation by a reconstruction processor 17 which applies an appropriate reconstruction algorithm. The MR image represents a three-dimensional volume. The image is then stored in an image memory where it may be accessed for converting projections or other portions of the image representation into an appropriate format for visualization, for example via a video monitor 18 which provides a human-readable display of the resultant MR image.

The essence of the 'silent' ZTE technique as applied by the invention is that RF excitation pulses are transmitted while a 'frequency-encoding' readout magnetic field gradient is switched on. The readout magnetic field gradient is not intended as a slice-selection gradient, which implies that the RF pulses have to be extremely short (typically in the order of 1 µs or 10 µs) to achieve sufficient excitation bandwidth.

Alternatively, RF pulses with a frequency sweep may be applied. The readout of FID signals takes place during intervals immediately after the RF pulses in the presence of the readout magnetic field gradient. These intervals are also preferably short (typically in the order of 100 µs or 1 ms). The readout magnetic field gradient has a strength and a direction that both stay substantially constant over each excitation/readout cycle. After each excitation/readout cycle, the direction is varied only gradually, e.g. by a few degrees (e.g. 2°). For a full sampling of k-space the readout magnetic field direction is varied until a spherical volume is covered with sufficient density.

According to the invention, self-refocusing ZTE imaging is achieved by a gradient echo refocusing mechanism. The pulse sequence is organized in a number of (two or more) segments, and each segment is divided into a number of loops. Each loop includes the acquisition of a number of radial k-space spokes. RF excitation is active only for the first loop (the FID acquisition loop) and turned off afterwards for the subsequent second and further loops (the gradient echo acquisition loops). The radial k-space spokes of each loop form a closed trajectory in k-space. In this way, the later loops form gradient echoes of the initial FIDs excited in the initial loop. With regard to the details of the self-refocusing ZTE imaging sequence adopted by the invention reference is made to US 2017/0307703 A1.

The invention proposes that the self-refocusing ZTE imaging sequence is repeated by application of first and second self-refocusing ZTE imaging sequences, wherein the number of radial k-space spokes and/or the repetition time used in the individual loops of the second self-refocusing ZTE imaging sequence ($N_2$, $TR_2$) differ from the number of radial k-space spokes and/or the repetition time used in the individual loops of the first self-refocusing ZTE imaging sequence ($N_1$, $TR_1$).

In more detail, the first zero echo time imaging sequence encompasses an FID acquisition loop comprising:
  i) setting a readout magnetic field gradient to define a readout direction;
  ii) radiating an RF pulse in the presence of the readout magnetic field gradient;
  iii) acquiring an FID signal as a radial k-space spoke in the presence of the readout magnetic field gradient. K-space is sampled along a first closed trajectory by repeating steps i) through iii) $N_1$ times with repetition time $TR_1$ under gradual variation of the readout direction from repetition to repetition. The FID acquisition loop is followed by one or more gradient echo acquisition loops, each comprising:
  iv) setting the readout magnetic field gradient again to define the readout direction;
  v) acquiring a gradient echo signal as a radial k-space spoke in the presence of the readout magnetic field gradient. K-space is sampled in the gradient echo acquisition loop again along the first closed trajectory by repeating steps iv) and v) $N_1$ times with repetition time $TR_1$ under gradual variation of the readout direction from repetition to repetition. Similarly, the subsequent second zero echo time imaging sequence encompasses an FID acquisition loop comprising:
  vi) setting a readout magnetic field gradient to define a readout direction;
  vii) radiating an RF pulse in the presence of the readout magnetic field gradient;
  viii) acquiring an FID signal as a radial k-space spoke in the presence of the readout magnetic field gradient, wherein k-space is sampled along a second closed trajectory by repeating steps vi) through viii) $N_2$ times with repetition time $TR_2$ under gradual variation of the readout direction from repetition to repetition. This FID acquisition loop of the second zero echo time imaging sequence is followed by one or more gradient echo acquisition loops, each comprising:
  ix) setting the readout magnetic field gradient again to define the readout direction;
  x) acquiring a gradient echo signal as a radial k-space spoke in the presence of the readout magnetic field gradient. Again, k-space is sampled in the gradient echo acquisition loop along the second closed trajectory by repeating steps ix) and x) $N_2$ times with repetition time $TR_2$ under gradual variation of the readout direction from repetition to repetition. The difference between the numbers of spokes ($N_1$, $N_2$) and/or the difference between the repetition times ($TR_1$, $TR_2$) applied in the two instances of the ZTE imaging sequence entails that the echo time attributed to the gradient echo signals of the acquired first series of gradient echoes differs from the echo time attributed to the gradient echo signals of the acquired second series of gradient echo signals. If the numbers of k-space spokes ($N_1$, $N_2$) and the repetition time values ($TR_1$, $TR_2$) are selected to be similar, the resulting echo spacing can be on the order of one millisecond, which is well-suited for robust water-fat separation by a Dixon algorithm. Hence, a MR image is reconstructed from the acquired gradient echo signals, wherein signal contributions of two or more chemical species (such as, e.g., water and fat) to the gradient echo signals are separated exploiting the different echo times attributed to the gradient echo signals of the first and second sequences of gradient echo signals respectively.

Figure 2:
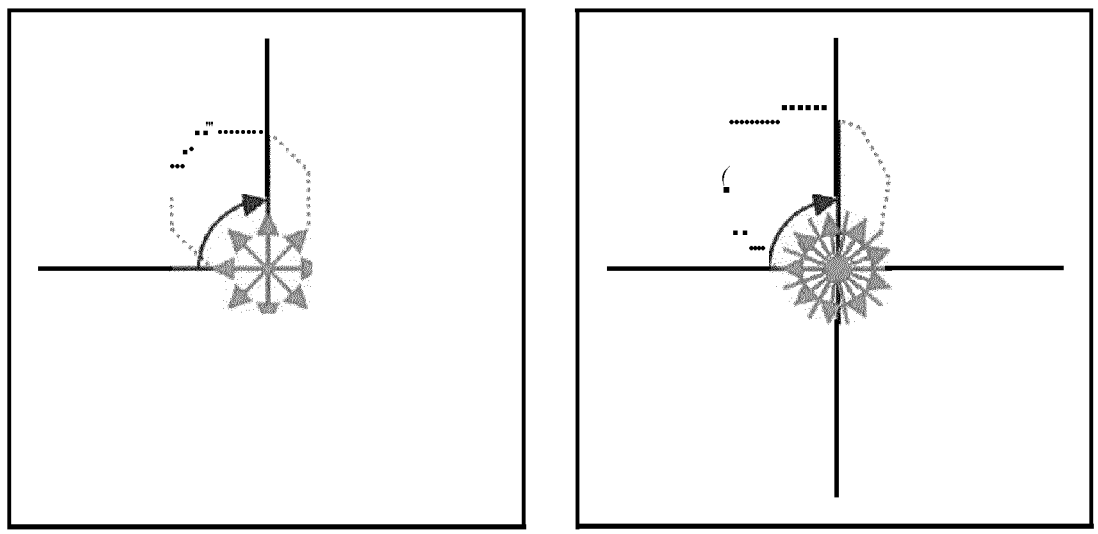
FIG. 2 provides an example of the k-space sampling of the repeated self-refocusing ZTE imaging approach according to the invention.

FIG. 2 provides an example of the k-space sampling according to the repeated self-refocusing ZTE imaging approach according to the invention. It schematically illustrates the case of segmented radial acquisitions with $N_1$=8 k-space spokes per segment for the first self-refocusing ZTE imaging sequence (left diagram) and $N_2$=9 k-space spokes per segment for the second self-refocusing ZTE imaging sequence (right diagram). The solid arrows indicate the k-space sampling of the FID signals and the dashed lines indicate the resulting cumulative closed k-space trajectories refocusing the first FID signal as a gradient echo after eight or nine repetitions respectively. The echo times of the gradient echo signals generated for $N_1$=8 and $N_2$=9 respectively differ by one repetition time $TR=TR_1=TR_2$ in this embodiment. TR is on the order of one millisecond such that robust water-fat separation is enabled.

In a similar fashion, different echo times attributed to the gradient echo signals can be achieved by choosing different values for $TR_1$ and $TR_2$. For example, with $N_1=N_2=8$ and $TR_1=1.0$ ms and $TR_2=1.125$ ms, the echo times of the gradient echo signals generated with $TR_1=1.0$ ms and $TR_2=1.125$ ms respectively differ again by one millisecond. Different repetition times can be obtained by increasing the spoiling for the self-refocusing ZTE imaging sequence with the longer TR, or by decreasing the readout magnetic field gradient strength. In any case, the flip angles of the RF excitation pulses, which may systematically vary over each of the sequences to implement a flip angle sweep, may be chosen differently for the two self-refocusing ZTE imaging sequences, e.g. to minimize differences in contrast due to the difference in TR.

The invention claimed is:

1. A method of magnetic resonance (MR) imaging of an object positioned in an examination volume of a MR device, the method comprising:

subjecting the object to a first self-refocusing zero echo time imaging sequence, wherein a first sequence of gradient echo signals is acquired as a first number $N_1$ of radial k-space spokes at a first repetition time $TR_1$, which first number $N_1$ of radial k-space spokes forms a first closed trajectory in k-space;

subjecting the object to a second self-refocusing zero echo time imaging sequence, wherein a second sequence of gradient echo signals is acquired as a second number $N_2$ of radial k-space spokes at a second repetition time $TR_2$, which second number $N_2$ of radial k-space spokes forms a second closed trajectory in k-space, wherein $N_2$ is not equal to $N_1$ and/or $TR_1$ is not equal to $TR_2$ such that different echo times are attributed to the gradient echo signals of the first and second sequences of gradient echo signals respectively; and reconstructing a MR image from the acquired gradient echo signals.

2. The method of claim 1, wherein signal contributions of two or more chemical species to the acquired gradient echo signals are separated in the step of reconstructing the MR image exploiting the different echo times attributed to the gradient echo signals of the first and second sequences of gradient echo signals respectively.

3. The method of claim 1, wherein the different echo times attributed to the gradient echo signals of the first and second sequences of gradient echo signals are exploited for reconstructing an effective transverse relaxation time ($T_2^*$)-weighted MR image and/or a $T_2^*$ map.

4. The method of claim 1, wherein the first zero echo time imaging sequence comprises:

an FID acquisition loop comprising the following steps:
i) setting a readout magnetic field gradient to define a readout direction;
ii) radiating an RF pulse in the presence of the readout magnetic field gradient;
iii) acquiring an FID signal as a radial k-space spoke in the presence of the readout magnetic field gradient,
wherein k-space is sampled along said first closed trajectory by repeating steps i) through iii) $N_1$ times with repetition time $TR_1$ under gradual variation of the readout direction from repetition to repetition, followed by one or more gradient echo acquisition loops comprising the following steps:
iv) setting the readout magnetic field gradient again to define the readout direction;
v) acquiring a gradient echo signal as a radial k-space spoke in the presence of the readout magnetic field gradient,
wherein k-space is sampled in the gradient echo acquisition loop again along the first closed trajectory by repeating steps iv) and v) $N_1$ times with repetition time $TR_1$ under gradual variation of the readout direction from repetition to repetition.

5. The method of claim 4, wherein the second zero echo time imaging sequence comprises:

an FID acquisition loop comprising the following steps:
vi) setting a readout magnetic field gradient to define a readout direction;
vii) radiating an RF pulse in the presence of the readout magnetic field gradient;
viii) acquiring an FID signal as a radial k-space spoke in the presence of the readout magnetic field gradient,
wherein k-space is sampled along said second closed trajectory by repeating steps vi) through viii) $N_2$ times with repetition time $TR_2$ under gradual variation of the readout direction from repetition to repetition, followed by one or more gradient echo acquisition loops comprising the following steps:
ix) setting the readout magnetic field gradient again to define the readout direction;
x) acquiring a gradient echo signal as a radial k-space spoke in the presence of the readout magnetic field gradient,
wherein k-space is sampled in the gradient echo acquisition loop again along the second closed trajectory by repeating steps ix) and x) $N_2$ times with repetition time $TR_2$ under gradual variation of the readout direction from repetition to repetition.

6. The method of claim 4, wherein a correction for motion occurring between the first, second and, where applicable, further self-refocusing zero echo time imaging sequences is derived from the acquired FID signals.

7. The method of claim 4, wherein the acquired FID signals are used in the reconstruction of the MR image to reduce noise and/or the $T_2^*$-weighting.

8. The method of claim 1, further comprising:
subjecting the object to at least one further self-refocusing zero echo time imaging sequence, wherein a further sequence of gradient echo signals is acquired as a further number of radial k-space spokes at a further repetition time $TR_1$, which further number of radial k-space spokes forms a further closed trajectory in k-space, wherein $N_1$ is different from both $N_1$ and $N_2$ and/or $TR_i$ is different from both $TR_1$ and $TR_2$; and
reconstructing the MR image from the acquired gradient echo signals, wherein signal contributions of the two or more chemical species to the gradient echo signals are separated exploiting the different echo times attributed to the gradient echo signals of the first, second and further sequences of gradient echo signals respectively.

9. The method of claim 1, wherein the differences between $N_1$ and $N_2$ and, where applicable, $N_i$ and/or the differences between $TR_1$ and $TR_2$ and, where applicable, $TR_i$ are determined such that the differences between the echo times attributed to the gradient echo signals of the first, second and, where applicable, further sequences are on the order of one millisecond.

10. A magnetic resonance (MR) device comprising at least one main magnet coil for generating a uniform, static magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit, wherein the MR device is configured to:

subject the object to a first self-refocusing zero echo time imaging sequence, wherein a first sequence of gradient echo signals is acquired as a first number $N_1$ of radial k-space spokes at a first repetition time $TR_1$, which first number $N_1$ of radial k-space spokes forms a first closed trajectory in k-space;

subject the object to a second self-refocusing zero echo time imaging sequence, wherein a second sequence of gradient echo signals is acquired as a second number $N_2$ of radial k-space spokes at a second repetition time $TR_2$, which second number $N_2$ of radial k-space spokes forms a second closed trajectory in k-space, wherein $N_2$ is not equal to $N_1$ and/or $TR_2$ is not equal to $TR_1$; so that different echo times are attributed to the gradient echo signals of the first and second sequences of gradient echo signals respectively; and reconstruct a MR image from the acquired gradient echo signals.

11. A computer program stored on a non-transitory computer readable medium to be run on a magnetic resonance (MR) device, which computer program comprises instructions for:

generating a first self-refocusing zero echo time imaging sequence, wherein a first sequence of gradient echo signals is acquired as a first number $N_1$ of radial k-space spokes at a first repetition time $TR_1$, which first number $N_1$ of radial k-space spokes forms a first closed trajectory in k-space;

generating a second self-refocusing zero echo time imaging sequence, wherein a second sequence of gradient echo signals is acquired as a second number $N_2$ of radial k-space spokes at a second repetition time $TR_2$, which second number $N_2$ of radial k-space spokes forms a second closed trajectory in k-space, wherein $N_2$ is not equal to $N_1$ and/or $TR_2$ is not equal to $TR_1$; so that different echo times are attributed to the gradient echo signals of the first and second sequences of gradient echo signals respectively; and reconstructing a MR image from the acquired gradient echo signals.

* * * * *